United States Patent [19]

Schlagheck

[11] Patent Number: 5,014,000
[45] Date of Patent: May 7, 1991

[54] VIBRATORY SCREENING FIXTURE

[76] Inventor: Jerry G. Schlagheck, 8256 Lakeshore Dr., West Chester, Ohio

[21] Appl. No.: 370,900

[22] Filed: Jun. 23, 1989

[51] Int. Cl.⁵ .................. G01R 31/02; G01N 29/00
[52] U.S. Cl. .................. 324/158 F; 73/663; 73/860
[58] Field of Search .......... 324/158 F; 269/277, 269/278, 279, 280, 281, 282, 283; 73/663-668, 577-578, 859-860

[56] References Cited

U.S. PATENT DOCUMENTS

| | | | |
|---|---|---|---|
| 893,875 | 7/1908 | Schneider | 269/277 |
| 1,249,207 | 12/1917 | Ruff | 269/279 |
| 1,336,610 | 4/1920 | Borchers | 269/277 |
| 2,838,971 | 6/1958 | Shekter | 269/279 |
| 3,675,299 | 7/1972 | Sherrill | 29/203 B |
| 3,826,483 | 7/1974 | Siegel | 269/203 |
| 4,061,323 | 12/1977 | Beekenkamp | 269/283 |
| 4,342,449 | 8/1982 | Illmann et al. | 269/43 |
| 4,566,839 | 1/1986 | Butler | 414/404 |
| 4,603,587 | 8/1986 | Kimball et al. | 73/663 |

*Primary Examiner*—Ernest F. Karlsen
*Attorney, Agent, or Firm*—Frost & Jacobs

[57] ABSTRACT

A fixture for securing a plurality of circuit boards during vibratory testing is shown, wherein the fixture comprises a first end fixture member having a first wall surface, and a second end fixture member space from the first end fixture member. The second end fixture member has a second wall surface facing the first wall surface, and the first and second end fixture members are relatively movable so as to very the spacing therebetween. Each of the first and second wall surfaces includes a plurality of spaced parallel notches for securing the opposite edges of a circuit board, and each of the notches is to have resilient characteristics to accommodate dimensional variations between similar circuit boards and an included angle in a range of 110° to 130° in order to secure a circuit board so that it is free to vibrate in a free-free manner during the vibratory testing. The fixture is also rigidly secured to a source of vibratory movement capable of providing one or more predetermined frequencies of vibration. This universal fixture can be utilized to support a virtually unlimited variety of circuit boards and cards as a result of its simple adjustability and resilient support notches.

19 Claims, 10 Drawing Sheets

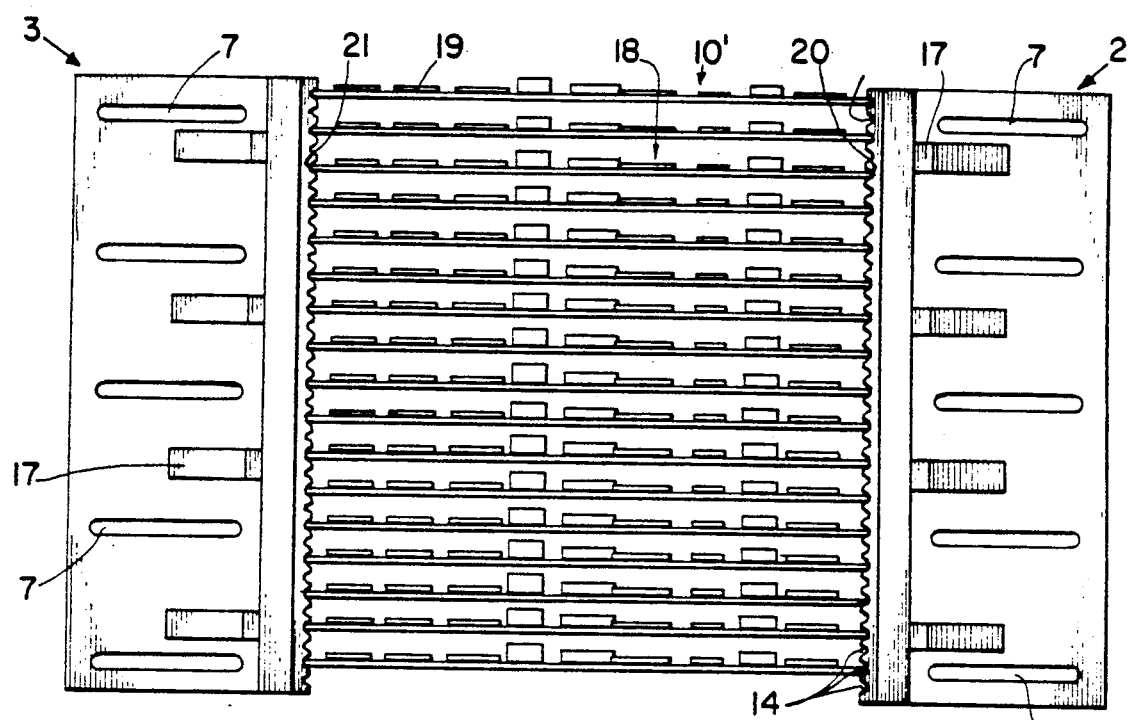
Fig. 2
Fig. 3
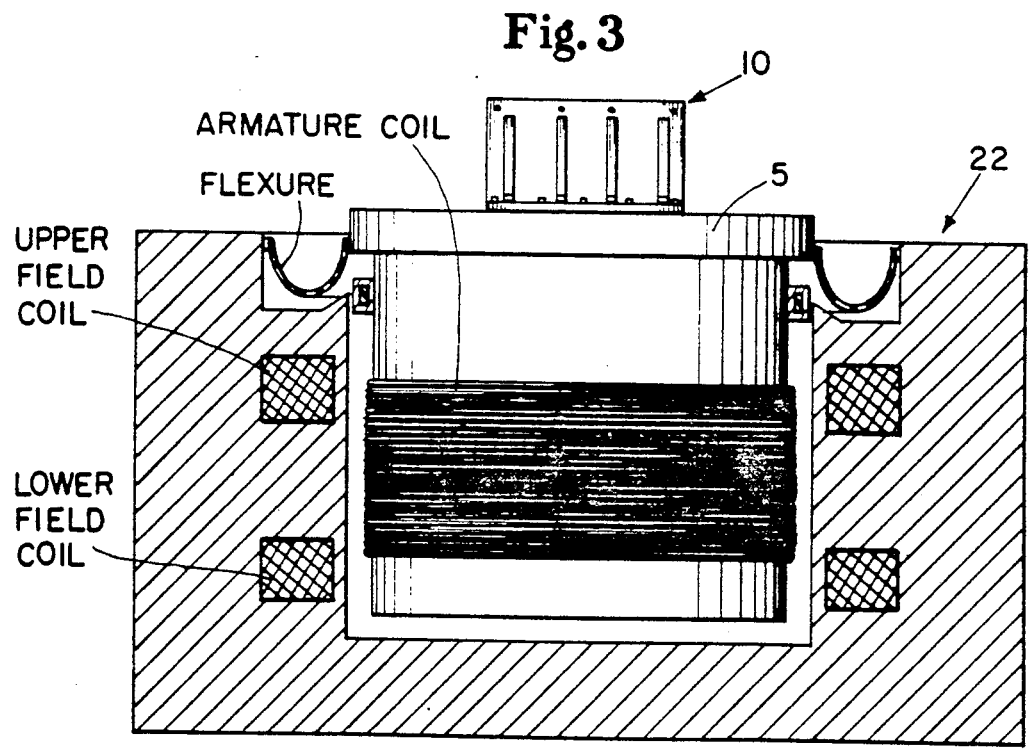

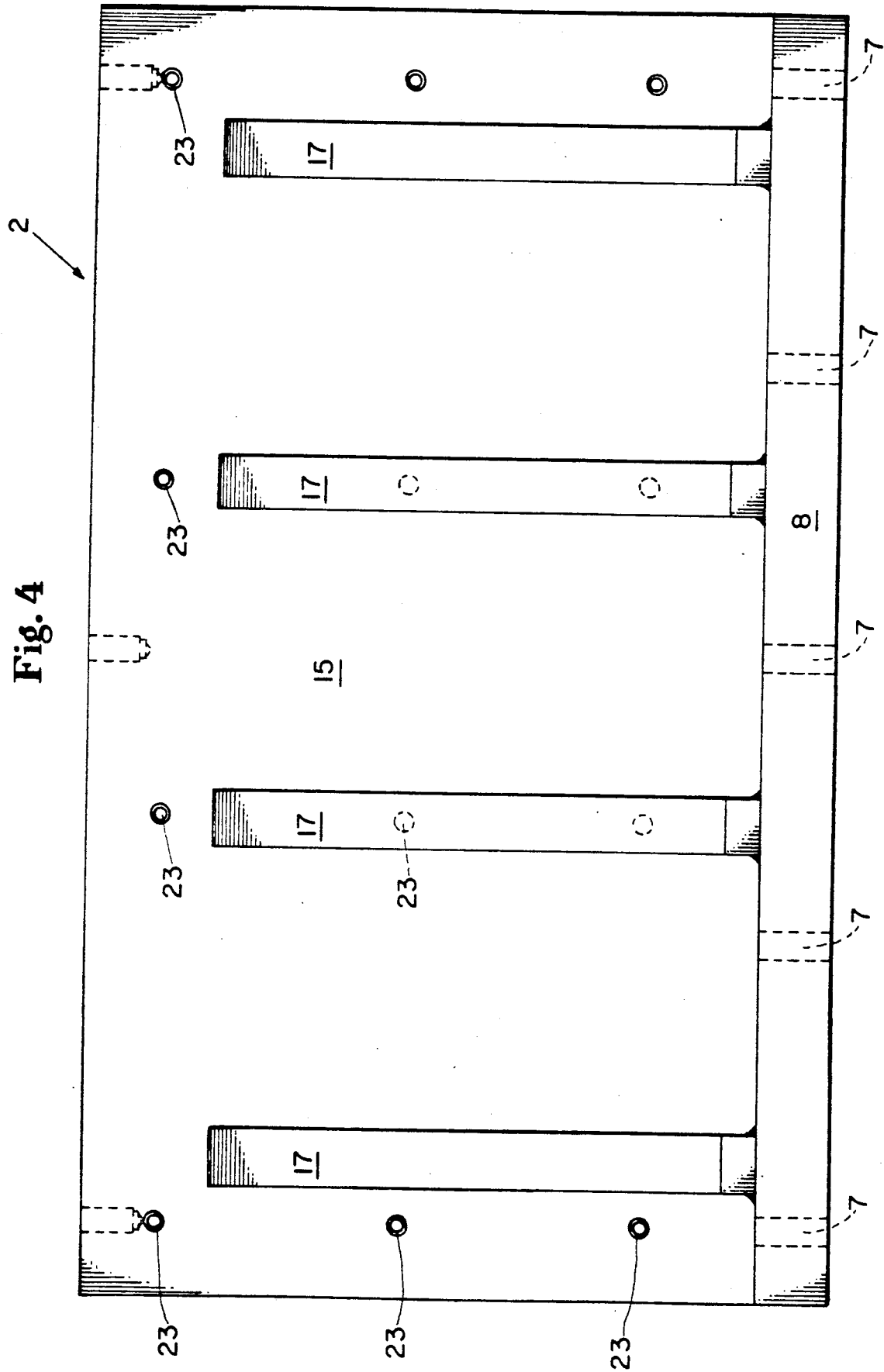

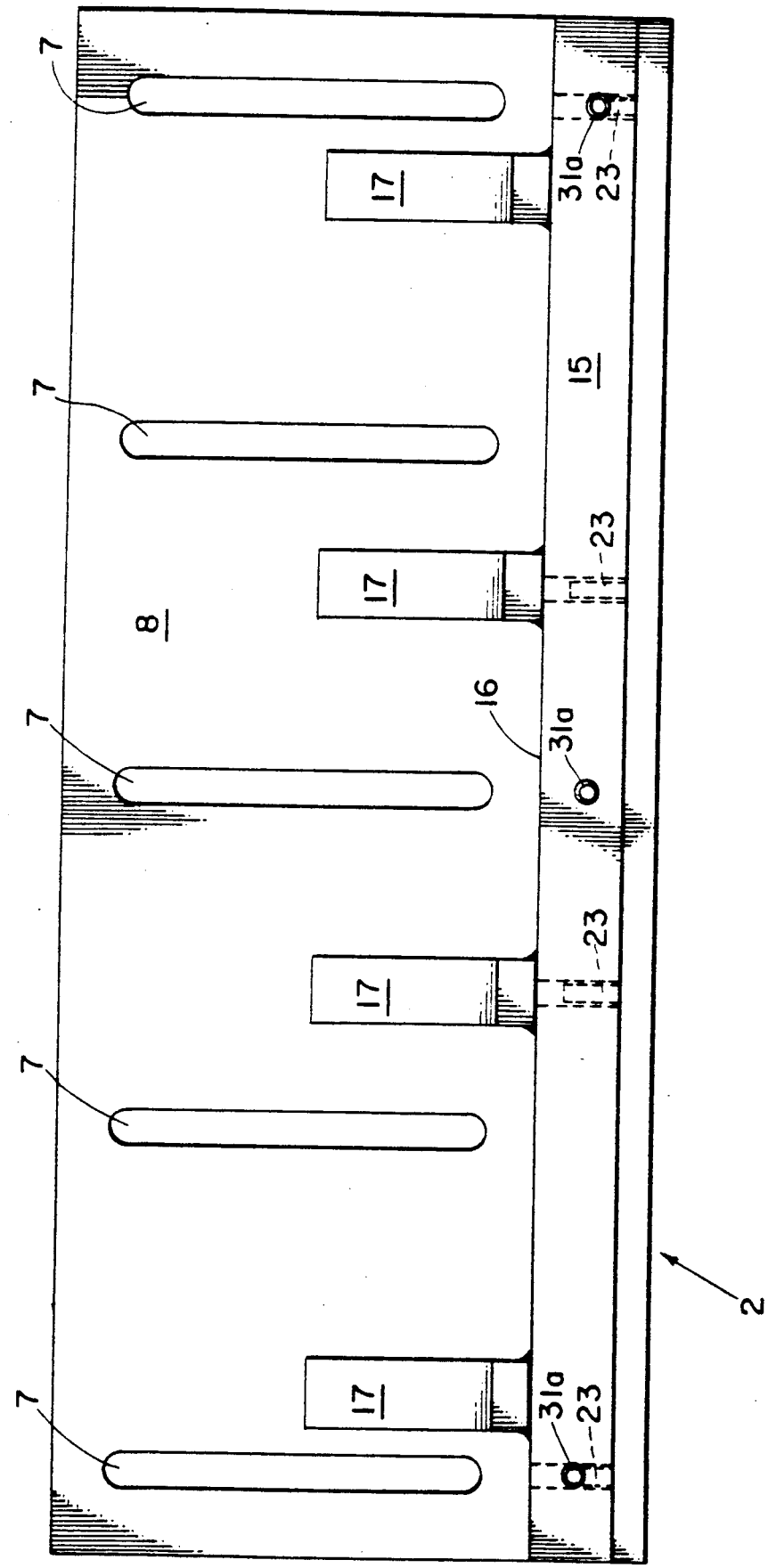

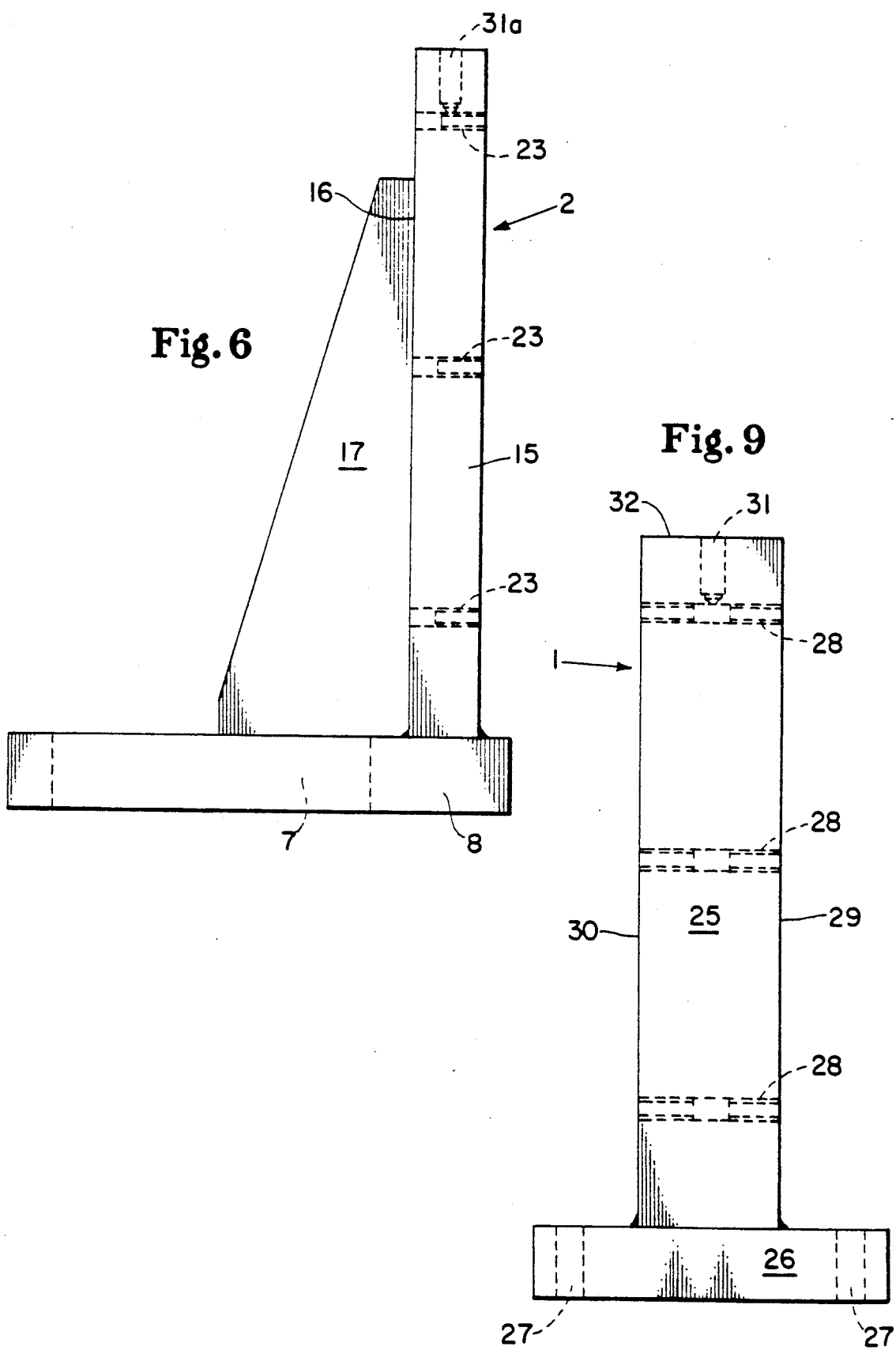

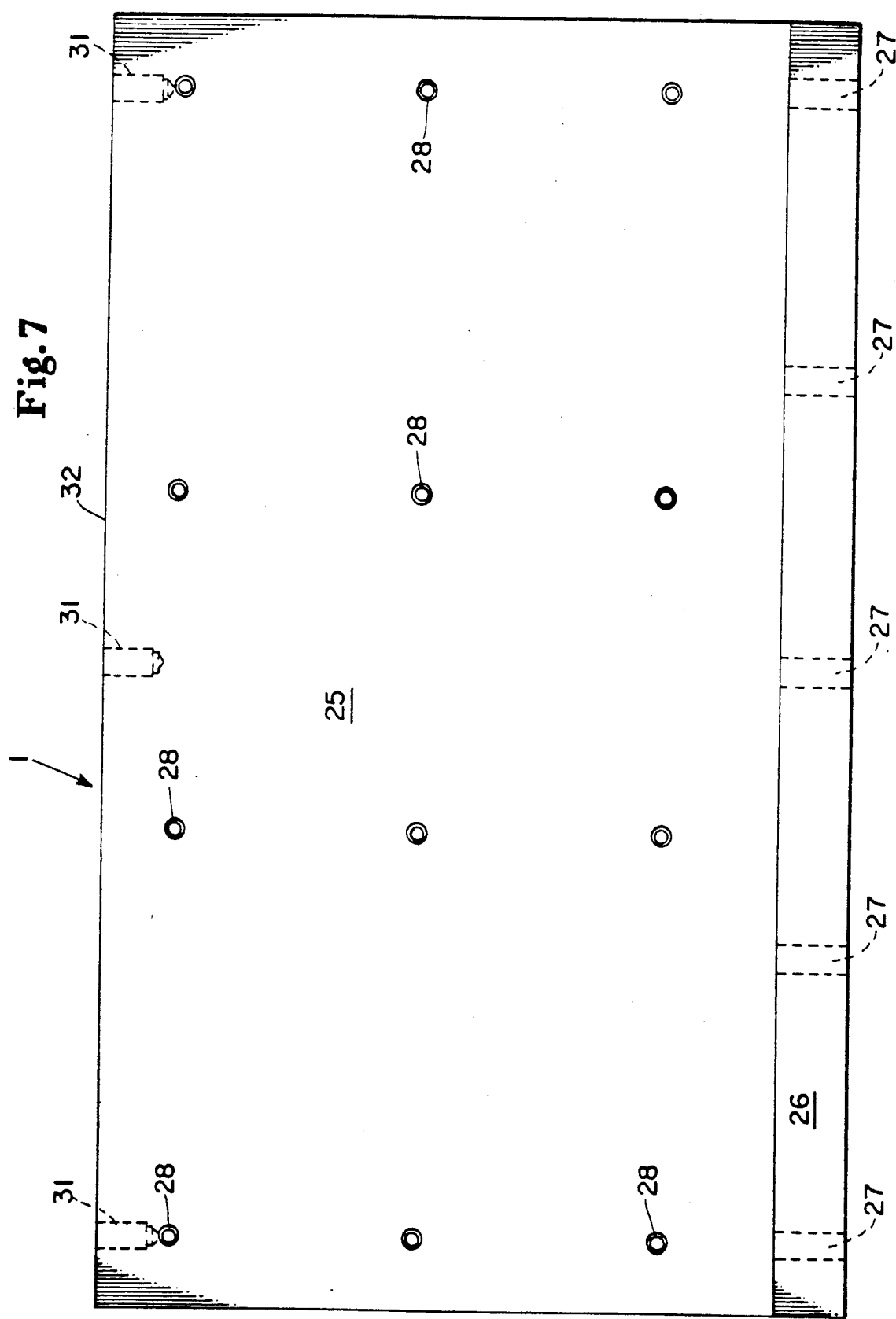

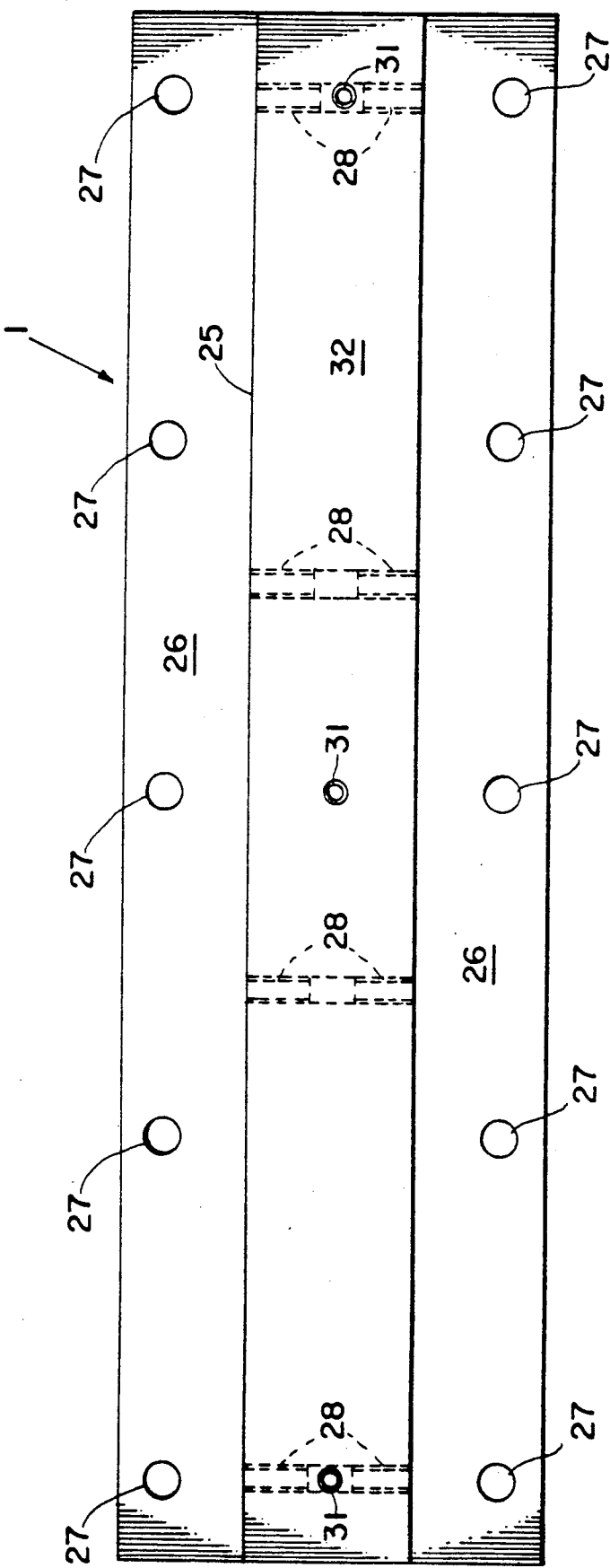

VIBRATORY SCREENING FIXTURE

TECHNICAL FIELD

The present invention relates generally to fixtures for screening electrical components to detect defects, and is particularly directed to vibratory screening fixtures for holding printed wiring boards or circuit boards which is secured to a shaker table and vibrated. The invention will be specifically disclosed in connection with a fixture which is readily adjustable to accommodate printed wiring boards of any size independent of the proximity of the electrical components to the edge of the board.

BACKGROUND OF THE INVENTION

Reliability of manufactured electronic components is a critical consideration for most electronic component manufacturers. Many manufacturers conduct testing of electronic components as a standard step in the manufacturing process. Such testing may range from testing of a statistically insignificant percentage of the total number of components produced selected periodically at random to one hundred percent testing of each and every electronic component produced.

In any event, testing can be directed toward two basic goals. One goal is to cause the component to fail by subjecting it to extreme conditions which will simulate the environmental conditions to which a component is expected to be exposed on an extraordinarily accelerated time period. An example of such testing is an accelerated duty cycle test in which the component is subjected to a number of duty cycles far in excess the number which the component will see during its expected life in a very short time period. Another goal is to subject the components to screen testing which is designed to turn marginal defects into detectible hard failures. Such screening is not intended to find design defects or to qualify a component, but is a process used to detect and eliminate defects during the manufacturing process.

Such screen testing is typically accomplished by carefully selected environmental stress screening procedures. These environmental stress screening procedures include thermal and dynamic screening which is developed for specific components.

Printed wiring boards (PWB) are used in most devices which incorporate electronics. Such devices frequently have numerous PWBs electrically connected to each other. PWBs carry individual electronic components electrically interconnected on the board. In a device which includes several PWBs, the premature failure of the PWB or a component carried by it, can result in the need to replace the PWB after the device has been sold to a customer and put in use, or result in the need to replace the entire device due to damage caused by such failure. In order to avoid such problems and risks of failures, PWBs are frequently screened to detect marginal defects prior to the board's individual sale or incorporation into an electronic device which is then subsequently sold to a consumer or user.

One effective method of environmentally stress screening a PWB is to subject it to dynamic vibrations. In order to do so, PWBs are typically mounted in fixtures which are secured to shaker tables and subjected to various vibrations induced by the shaker table. In order to incorporate such screening as part of the manufacturing process, it is necessary that the fixture allow easy and quick insertion and removal of the PWBs being screened. Additionally, since most PWB manufacturers boards vary in size and componentry, it is necessary for the fixture to be easily adaptable to accept various boards.

To accomplish this, the industry has made use of adjustable fixtures having substantially parallel opposing faces with vertical grooves formed therein. These grooves or notches as are known in the art are aligned with the notches on the opposing face. The notches used heretofore have had an included angle of ninety degrees. Such notches, however, present a problem in that they are not readily adaptable to the wide range of PWBs being manufactured.

SUMMARY OF THE INVENTION

Accordingly, it is a primary object of the present invention to provide a vibratory screening fixture for holding PWBs during dynamic vibratory screening which can accommodate the wide range of PWBs being manufactured.

It is another object of the present invention to provide a vibratory screening fixture which has notches that are configured to accept the wide range of PWBs being manufactured.

Additional objects, advantages and other novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the foregoing in other objects, and in accordance with the purposes of the present invention as described herein, an improved vibratory screening fixture is provided having a pair of opposing end fixture members which define a PWB receiving space. The face of each member includes a plurality of vertical notches which are lined with a rubber facing selected to couple the energy in the frequency domain of the screening procedure. The notches have an included angle of at least 110 degrees.

Still other objects of the present invention will become apparent to those skilled in this art from the following description wherein there is shown and described a preferred embodiment of this invention, simply by way of illustration, of one of the best modes contemplated for carrying out the invention. As will be realized, the invention is capable of other different embodiments, and it several details are capable of modification in various, obvious aspects all without departing form the invention. Accordingly, the drawings and descriptions will be regarded as illustrative in nature and not as restrictive.

BRIEF DESCRIPTION OF THE DRAWINGS

The accompanying drawings incorporated in and forming a part of the specification illustrate several aspects of the present invention, and together with the description serve to explain the principles of the invention. In the drawings:

FIG. 2 is a top view of another arrangement of the preferred embodiment of the present invention.

FIG. 3 is a diagrammatic view of an electrodynamic shaker with the outside housing in cross-section.

FIG. 4 is a side view of an end fixture member.

FIG. 5 is a top view of the end fixture member of FIG. 4.

FIG. 6 is a side view of the end fixture member of FIG. 4.

FIG. 7 is a side view of the central fixture member of FIG. 1.

FIG. 8 is a top view of the central fixture member of FIG. 7.

FIG. 9 is an end view of the central fixture member of FIG. 7.

Reference will now be made in detail to the present preferred embodiment of the invention, an example of which is illustrated in the accompanying drawings.

DETAIL DESCRIPTION OF THE PREFERRED EMBODIMENT

Figure 1:
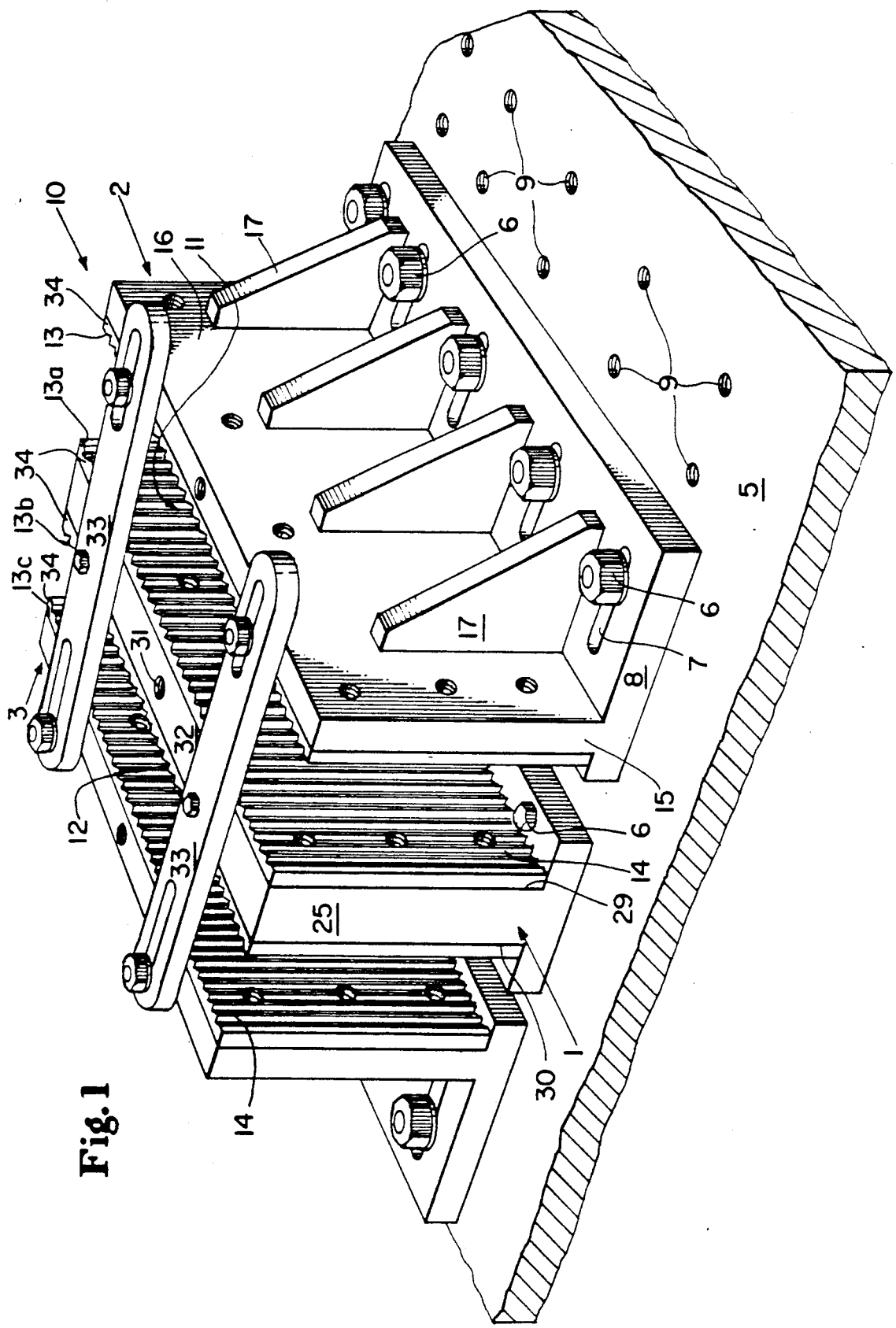
FIG. 1 is an perspective view of a vibratory screening fixture mounted to a shaker table in accordance with the present invention.

Referring now to the drawings, FIG. 1 shows an improved vibratory screening fixture 10 which includes a central fixture member 1 with end fixture members 2 and 3 spaced apart from central fixture member 1. Central fixture member 1 is secured to the shaker table 5 by a plurality of fasteners 6 which rigidly secure the central fixture member 1 to the shaker table 5. End fixture member 2 is spaced apart from central frame member 1 and rigidly secured to shaker table 5 by a plurality of fasteners 6.

End fixture member 2 has a plurality of space adjustment slots 7 disposed through its base portion 8. The adjustment slots 7 allow the spacing between central fixture member 1 and end fixture member 2 to be adjusted so that the space between the two members 1, 2 is adapted to receive a printed wiring board (not shown). The spacing between the two members 1, 2 is selected so as to securely hold the printed wiring board therebetween. Shaker table 5 has a plurality of fastener receiving holes 9 located on a grid pattern at 2" spacing. Thus, the end fixture member 2 may be located on shaker table 5 relative to central fixture member 1 so as to create a space therebetween to accommodate a plurality of printed wiring boards that may vary as a group in length.

End fixture member 3 is also secured to shaker table 5 in this manner. Thus, the vibratory screening fixture 10 includes two printed wiring board receiving spaces 11 and 12. On each wall surface 13, 13a, 13b, 13c adjacent the board receiving space 11, 12, includes a plurality of vertically disposed notches 14, schematically shown in FIG. 1 and described in detail below.

End fixture member 2 is shown having base portion 8 and wall portion 15. The outer wall surface 16 of wall portion 15 forms a right angle with base portion 8. Triangular shaped gussets 17 are disposed adjacent outer wall surface 16 and base portion 8, providing support between wall portion 15 and base portion 8 and providing rigidity to the end fixture member 2. End fixture member 3 is constructed identical to end fixture member 2.

FIG. 2 shows a second arrangement of the vibratory screening fixture 10' which is comprised of end fixture member 2 and end fixture member 3 forming a printed wire board receiving space 18 therebetween. A plurality of printed wiring boards 19 are shown disposed in space 18, with edges 20 and 21 being disposed in opposing notches 14. As can be seen by FIG. 2, a plurality of printed wiring boards 19 of substantially the same length are disposed substantially parallel to each other in space 18. Boards 19 may be inserted and removed from space 18 by moving them parallel to notches 14 into or out of the fixture 10'.

For any particular production setup, it is anticipated that the width of receiving space 18 will be adjusted for the particular boards 19 being screened at that time. As production requirements result in a change of length of the board, either end fixture member 2 or 3, or both, may be adjusted so as to increase or decrease the width of space 18 to accommodate the anticipated board size. With respect to board height as defined by the electrical components disposed thereon, the boards are disposed in space 18 by skipping the necessary number of notches 14 between each board so as to allow adequate spacing.

FIG. 3 shows an electrodynamic shaker 22 shown diagrammatically with the housing shown in cross-section. Shaker table 5 has fixture 10 rigidly secured to it. Depending on the screening procedure being used, shaker table 5 may be vibrated in one axis, two axes or three axes. The shaker table 5 may be vibrated at any frequency as has been determined to effect the screening process. Typically, the vibration will be a complex composition of frequencies in the range of 20 to 2000 Hertz, with preselected amplitudes at preselected frequencies. The exact frequency spectrum is selected to tailor the screening procedure to the specific components being screened. The present preferred embodiment of the screening fixture 10 is intended for use in the range of 20 to 2000 Hertz, and is described in conjunction therewith. However, the exact parameters of the present invention may be modified to practice the principles with other frequency ranges.

FIGS. 4 through 14 detail the construction of the preferred embodiment of the present invention. FIGS. 4, 5 and 6 show end fixture member 2. Gussets 17 are vertically disposed uniformally along the length of end fixture member 2. A plurality of threaded holes 23 are shown formed through wall portion 15, having uniform spacing and locations. As will be described below, these threaded holes are used to secure the adapter plate 34 to the wall portion 15 of end fixture member 2. Threaded holes 31a are formed through the top surface of wall portion 15, and are disposed for receiving threaded fasteners for securing upper braces 33 (FIG. 1) thereto.

FIGS. 7, 8 and 9 show three views of the central fixture member 1 which is used in the arrangement of the preferred embodiment shown in FIG. 1. Central fixture member 1 has a wall portion 25 rigidly secured or formed integral with base portion 26. Base portion 26 has a plurality of bolt holes 27 formed therethrough, through which fasteners 6 (FIG. 1) are disposed to rigidly secure central fixture member 1 to shaker table 5. Formed through wall portion 25 is a plurality of threaded holes 28 for attaching the adaptor plate 34 to either surface 29, 30 of wall portion 25. It should be noted that the locations of threaded holes 28 as shown are identical to the locations of threaded holes 23 of end fixture member 2 so as to accommodate a single version of the adaptor plate 34. Threaded holes 31 are shown formed through the top surface 32, and are disposed for receiving threaded fasteners for securing upper braces 33 (FIG. 1) to its top surface 32.

Figure 10:
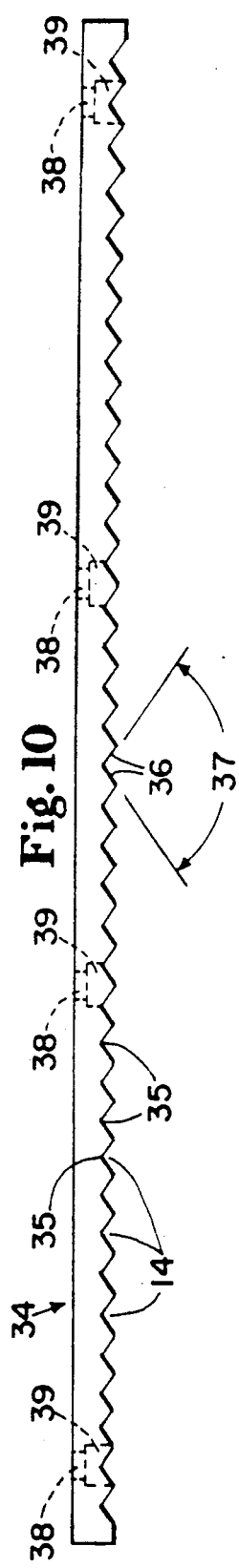
FIG. 10 is a top view of the adapter plate.
Figure 11:
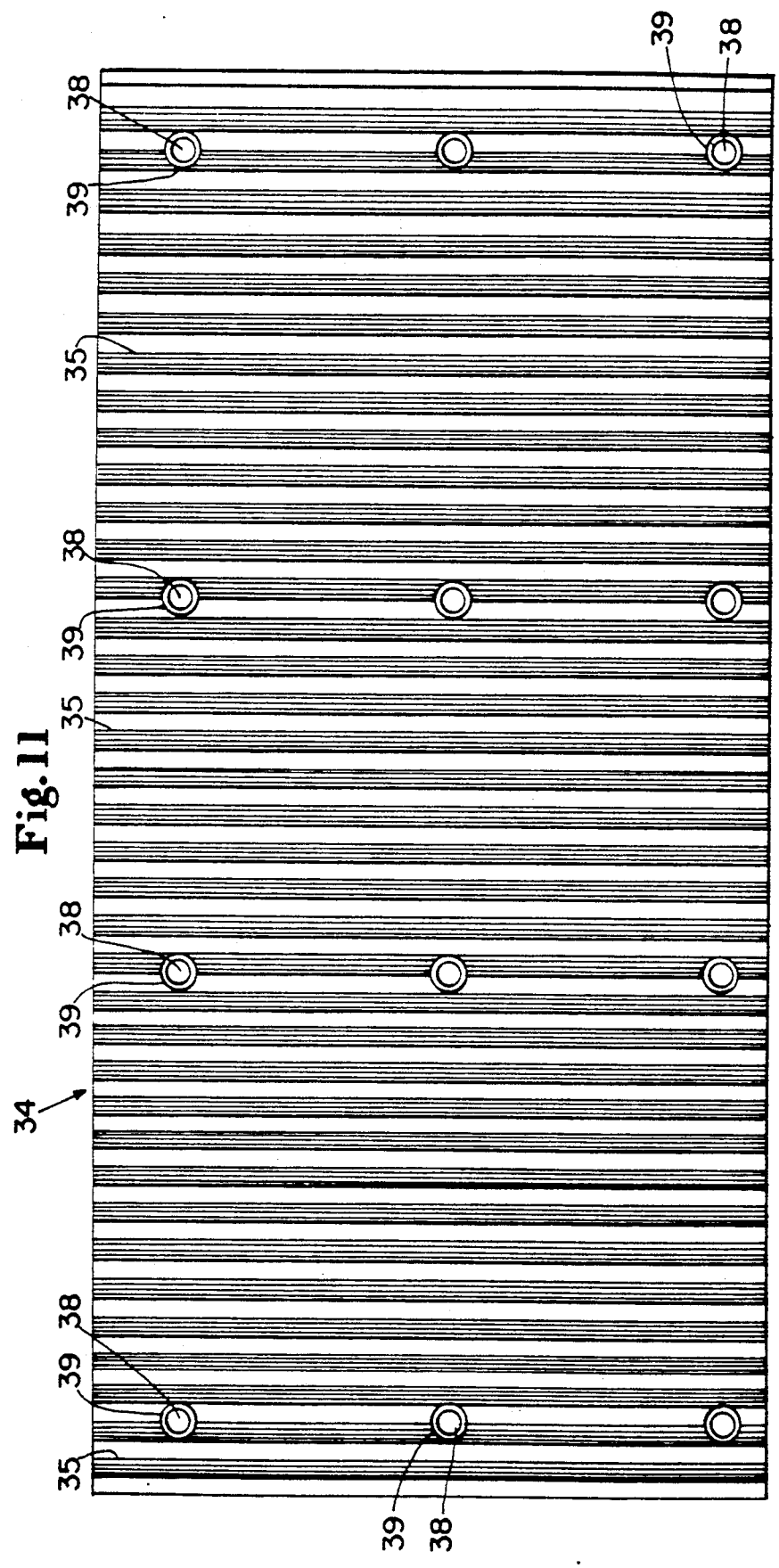
FIG. 11 is a side view of the adapter plate of FIG. 10.
Figure 12:
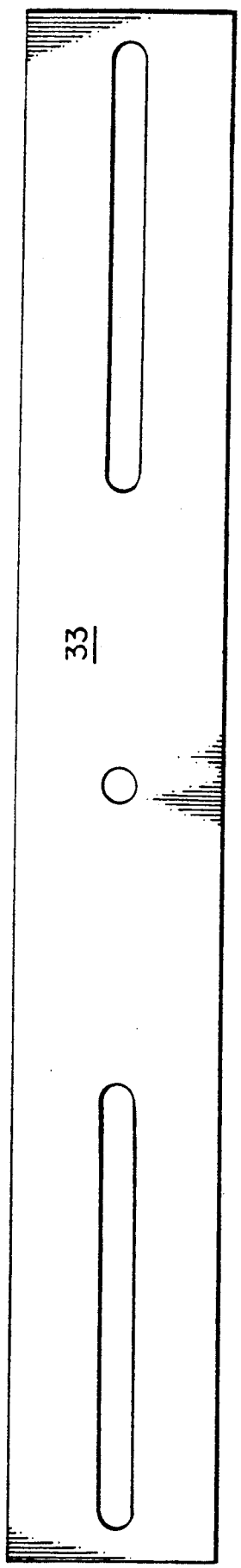
FIG. 12 is a top view of the brace shown in FIG. 1.
Figure 13:
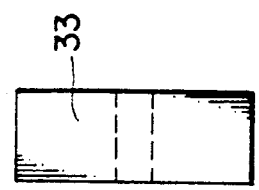
FIG. 13 is an end view of the brace of FIG. 12.

FIGS. 10 and 11 show adaptor plate 34. FIG. 10 is a top view showing the notches 14 formed in one surface of adaptor plate 34. In the preferred embodiment, the distance between the centers 35 of the notches 14 is ½ inch. The walls 36 of notches 14 form an included angle therebetween of 110 degrees. This angle may range as high as 130 degrees. Angle 37 must not be less than 110 degrees. The inventor has observed that angles as high as 130 degrees are acceptable.

A plurality of holes 38 are formed through adaptor plate 34 in a pattern complementary to the pattern of threaded holes 23 of end fixture member 2 and threaded holes 28 of central fixture member 1. Holes 38 include a countersunk bore 39 designed to receive socket head cap screws (not shown) as are commonly used in vibratory testing and screening. As indicated by FIG. 1 and FIG. 2, adapator plate 34 is secured to wall portion 15 of end fixture member 2 adjacent the printed wiring board receiving space 11. Similarly, adaptor plates 34 are secured to both surfaces 29, 30 of wall portion 25 of central fixture member 1, respectively adjacent printed wiring board receiving spaces 11 and 12. Another adaptor plate 34 is secured to end fixture member 3 in a similar manner as described with respect to end fixture member 2.

Central fixture member 1, end fixture members 2 and 3, and adaptor plate 34 may be formed of any appropriate material. In the preferred embodiment, the material selected is magnesium due to its low Q, that being transmissability.

The threaded fasteners (not shown) which secure adapter plate 34 to the respective fixture member (1, 2 or 3) have a free length selected such that the natural frequency of the adaptor plate and associated threaded fasteners is outside the frequency range for which the fixture 10 is designed. In the preferred embodiment, the threaded fasteners and adaptor plate 34 have a natural frequency outside the range of 20 to 2000 hertz.

Figure 14:
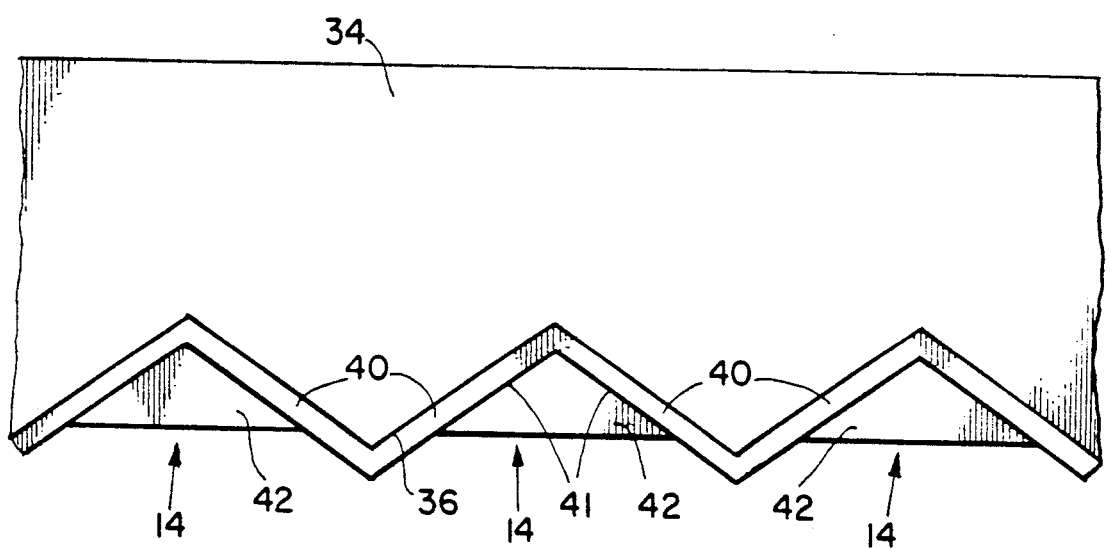
FIG. 14 is an enlarged fragmentary top view of the rubber faced notches of the fixture members of FIG. 1.

FIG. 14 shows an enlarged fragmentary top view of adaptor plate 34 and notches 14. Walls 36 are lined with a rubber facing 40 which has walls 41 which form the same included angle 37 as that of walls 36. Rubber facing 40 is attached to walls 36 by any well known adhesive suitable for that purpose. Rubber facing 40 has a durometer in the range of 45 to 65. The hardness of the rubber is such that it can accommodate minor dimensional variations between similar boards 19 (shown in FIG. 2). In general, the rubber material used is selected so as to couple the energy from the frequency domain of the screening procedure to the boards 19. A durometer in the range of 45 to 65, as identified above, has been observed to couple the energy in the frequency domain of 20 to 2000 hertz with minimal dampening effect.

Also shown in FIG. 14 is optional lower plate 42 which is secured adjacent the lower end of notches 14, and oriented so as to prevent the boards 19 from slipping down below the lower edge of adaptor plate 34.

When boards 19 are held by vibratory screening fixture 10 or 10' as described above, they are free to vibrate in a free-free manner. The boards 19 are not rigidly held on edges 20 or 21 so as to allow this type of vibration. As one skilled in the art can easily appreciate by this disclosure, the vibratory screening fixture 10 or 10' may be adjusted like bookends to accommodate a wide variety of boards 19. The present invention is particularly useful in conjunction with production quantities.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments with various modifications as are suited to the particular use contemplated. It is intended that the scope of the invention be defined by the claims amended hereto.

I claim:

1. A fixture for securing one or more of circuit boards during vibratory testing, said fixture comprising:
    a first end fixture member, said first end fixture member having a first wall surface;
    a second end fixture member spaced from said first end fixture member, said second end fixture member having a second wall surface facing said first wall surface, said first and second end fixture members being relatively movable so as to vary the spacing between said first and second wall surfaces, each of said first and second wall surfaces including a plurality of spaced parallel notches for securing the edge of a circuit board, each of said notches having resilient means for accomodating dimensional variations between similar circuit boards and an included angle in a range of 110 to 130 degrees to secure a circuit board so that it is free to vibrate in a free-free manner during said vibratory testing; and
    means for rigidly securing said fixture to a source of vibratory movement capable of providing one or more predetermined frequencies of vibration.

2. The fixture of claim 1, further comprising an adapter plate attached each of said fist and second wall surfaces, said adapter plate comprising said notches for securing opposite edges of a circuit board during vibratory testing.

3. The fixture of claim 2, wherein said adapter plates further comprise walls lined with material which is at least partially resilient to provide resilient notches to both secure the edges of a circuit board and to accommodate minor dimensional variations between similar circuit boards to be secured.

4. The fixture of claim 3, wherein said adapter plate are lined with rubber material having a hardness in a durometer range of between about 45 and about 65.

5. The fixture of claim 1, wherein said notches are formed as substantially V-shaped vertical grooves.

6. The fixture of claim 1, wherein said source of vibratory movement provides a composition of several vibration frequencies in a range of between about 20 and about 2000 hertz, and wherein said means for rigidly securing said fixture comprises fasteners for attaching said first and second end fixture members to a shaker table.

7. The fixture of claim 6, wherein said means for securing said fixture to a shaker table includes a plurality of spaced adjustment slots for providing adjustable attachment of at least one of said first and second fixture members to said table, whereby said relative spacing between said first and second wall surfaces can be varied.

8. The fixture of claim 1, further comprising a central fixture member spaced between said first and second fixture members, said central fixture member having third and fourth wall surfaces each facing one of said first and second end fixture members, and wherein the spacing between opposed pairs of wall surfaces can be varied as desired to accommodate edges of circuit boards to be secured.

9. A fixture for securing a plurality of circuit boards for vibratory testing in a free - free manner, said fixture comprising:
   a first end fixture member, said first end fixture member having a first wall surface; and
   a second end fixture member spaced from said first end fixture member, said second end fixture member having a second wall surface facing said first wall surface, said first and second end fixture members being relatively movable so as to vary the spacing between said first and second wall surfaces, each of said first and second wall surfaces including a plurality of spaced parallel resilient notches for securing an edge of a circuit board, and an adapter plate attached to each of said first and second wall surfaces, said adapter plate comprising said resilient notches for securing opposite edges of said circuit boards during vibratory testing, and each of said resilient notches having an included angle in a range of 110 to 130 degrees to secure a circuit board so that it is free to vibrate in a free-free manner during said vibratory testing.

10. The fixture of claim 9, further comprising a central fixture member spaced between said first and second end fixture members and having third and fourth wall surfaces each facing one of said first and second end fixture members, said central fixture member having a pair of adapter plates attached to said third and fourth wall surfaces and providing a plurality of resilient notches for securing the edges of a plurality of circuit boards, and wherein the spacing between each pair of opposed wall surfaces can be varied as desired.

11. The fixture of claim 10, wherein said adapter plates further comprise walls lined with material which is at least partially resilient to provide said resilient notches to secure the edges of a circuit board and to accommodate minor dimensional variations between similar circuit boards to be secured.

12. The fixture of claim 10, further comprising means for rigidly securing said fixture to a source of vibratory movement capable of providing one or more predetermined frequencies of vibration.

13. The fixture of claim 12, wherein said source of vibratory movement provides a composition of several vibration frequencies in a range of between about 20 and about 2000 hertz, and wherein said means for rigidly securing said fixture comprises fasteners for selective attachment of said first, second and central fixture members to a shaker table.

14. A fixture for securing a plurality of circuit boards for vibratory testing in a free - free manner, said fixture comprising:
   a first end fixture member, said first end fixture member having a first wall surface;
   a second end fixture member spaced from said first end fixture member, said second end fixture member having a second wall surface facing said first wall surface, said first and second end fixture members being relatively movable so as to vary the spacing between said first and second wall surfaces, each of said first and second wall surfaces including a plurality of spaced parallel resilient notches for securing the edge of a circuit board;
   a central fixture member spaced between said first and second end fixture members and having oppositely facing third and fourth wall surfaces each facing one of said first and second end fixture members; and
   wherein the spacing between each opposed facing pair of wall surfaces can be varied as desired and each of said resilient notches have an included angle in a range of 110 to 130 degrees to secure a circuit board so that it is free to vibrate in a free-free manner during said vibratory testing.

15. The fixture of claim 14, further comprising an adapter plate attached to each of said wall surfaces, said adapter plates each comprising said resilient notches for securing opposite edges of said circuit boards during vibratory testing.

16. The fixture of claim 15, wherein said adapter plates further comprise walls lined with material which is at least partially resilient to provide said resilient notches to secure the edges of a circuit board and to accommodate minor dimensional variations between similar circuit boards to be secured.

17. The fixture of claim 14, further comprising means for rigidly securing said fixture to a source of vibratory movement capable of providing one or more predetermined frequencies of vibration.

18. The fixture of claim 17, wherein said means for rigidly securing said fixture comprises fasteners for attaching said first and second end fixture members and said central fixture member to a shaker table in a desired spaced relationship.

19. The fixture of claim 18, further comprising threaded fasteners for securing each of said adapter plates to its respective fixture member, and wherein said threaded fasteners have a free length selected such that the natural frequency of said adapter plate and the associated threaded fasteners is outside the range of said predetermined frequencies of vibration of the source of vibratory movement.

* * * * *